US007332439B2

(12) United States Patent
Lindert et al.

(10) Patent No.: US 7,332,439 B2
(45) Date of Patent: Feb. 19, 2008

(54) METAL GATE TRANSISTORS WITH EPITAXIAL SOURCE AND DRAIN REGIONS

(75) Inventors: Nick Lindert, Beaverton, OR (US); Justin K. Brask, Portland, OR (US); Andrew Westmeyer, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 445 days.

(21) Appl. No.: 10/955,669

(22) Filed: Sep. 29, 2004

(65) Prior Publication Data

US 2006/0068590 A1 Mar. 30, 2006

(51) Int. Cl.
*H01L 21/302* (2006.01)

(52) U.S. Cl. ...................... 438/696; 438/199; 438/546; 438/926; 438/957; 430/5

(58) Field of Classification Search .................... 430/5; 438/199, 546, 696, 926, 957
See application file for complete search history.

(56) References Cited

U.S. PATENT DOCUMENTS 4,198,250 A * 4/1980 Jecmen ....................... 438/301
6,214,679 B1 4/2001 Murthy et al.
6,524,920 B1 2/2003 Yu
6,777,761 B2 * 8/2004 Clevenger et al. .......... 257/388
7,078,284 B2 * 7/2006 Trivedi ....................... 438/197
7,084,025 B2 * 8/2006 Phua et al. ................. 438/199
2003/0011037 A1 1/2003 Chau et al.
2003/0107088 A1 6/2003 Inumiya et al.
2005/0087801 A1 4/2005 Lindert et al.

FOREIGN PATENT DOCUMENTS

JP 58-201363 * 11/1983

* cited by examiner

*Primary Examiner*—George A. Goudreau
(74) *Attorney, Agent, or Firm*—Blakely, Sokoloff, Taylor & Zafman LLP

(57) ABSTRACT

An MOS transistor formed on a heavily doped substrate is described. Metal gates are used in low temperature processing to prevent doping from the substrate from diffusing into the channel region of the transistor.

14 Claims, 7 Drawing Sheets

METAL GATE TRANSISTORS WITH EPITAXIAL SOURCE AND DRAIN REGIONS

FIELD OF THE INVENTION

The invention relates to the field of MOS transistors, particularly those fabricated with epitaxial source and drain regions.

PRIOR ART AND RELATED ART

Delta-doped transistors are described in Noda et al. "0.1 μm Delta-Doped MOSFET Using Post Low Energy Implanting Selective Epitaxy," *VLSI Technology* 1994. Digest of Technical Papers. The motivation for the Delta-doped transistor is that higher mobility (less impurity scattering) is achieved with an un-doped or lightly doped channel. Such devices are also described in patent application Ser. No. 10/692,696, filed Oct. 24, 2003, titled "Epitaxially Deposited Source/Drain," assigned to the assignee of the present application.

The fabrication of these transistors relies in large part upon the difference in the doping levels between the heavily doped substrate and the lightly doped or un-doped epitaxially formed surface of the substrate. An etchant is able to discriminate between the surface region and the main body of the substrate because of this difference in doping levels. One problem that occurs, however, is that when the gate structures are formed, relatively high temperature processing is needed to, for instance, activate the doping in a polysilicon gate. This causes the diffusion of the dopant from the substrate into the channel region, thereby deteriorating the performance of the transistors.

DETAILED DESCRIPTION

A process for fabricating complementary metal-oxide-semiconductor (MOS) field-effect transistors and the resultant transistors are described. In the following description, numerous specific details are set forth such as specific dopant concentration levels, specific chemicals, etc. in order to provide a thorough understanding of the present invention. It will be apparent to one skilled in the art that these specific details are not required to practice the present invention. In other instances, well-known processing steps, such as cleaning steps, are not described in detail in order not to unnecessarily obscure the following disclosure.

Figure 1:
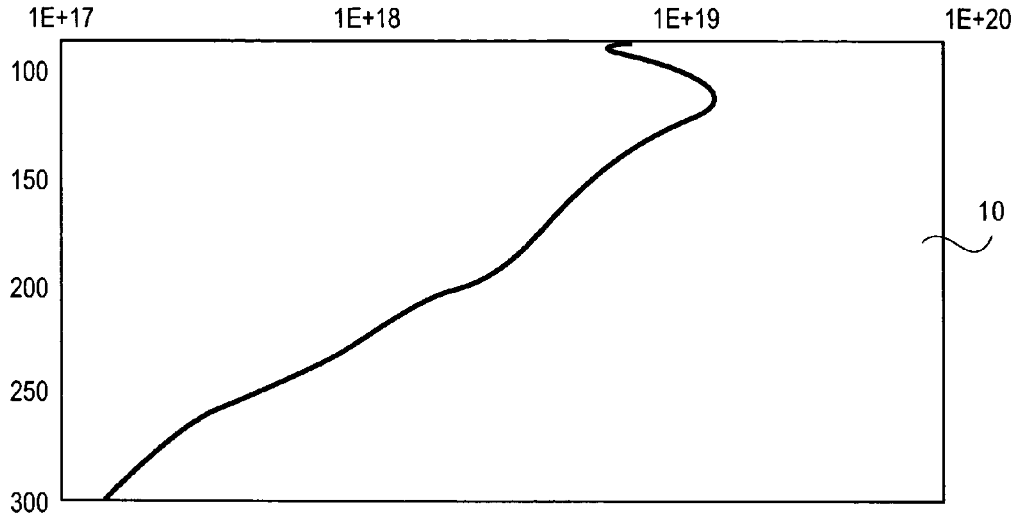
FIG. 1 is a cross-sectional, elevation view of the upper portion of a silicon substrate used to illustrate the doping profile in the upper region of the substrate.
Figure 2:
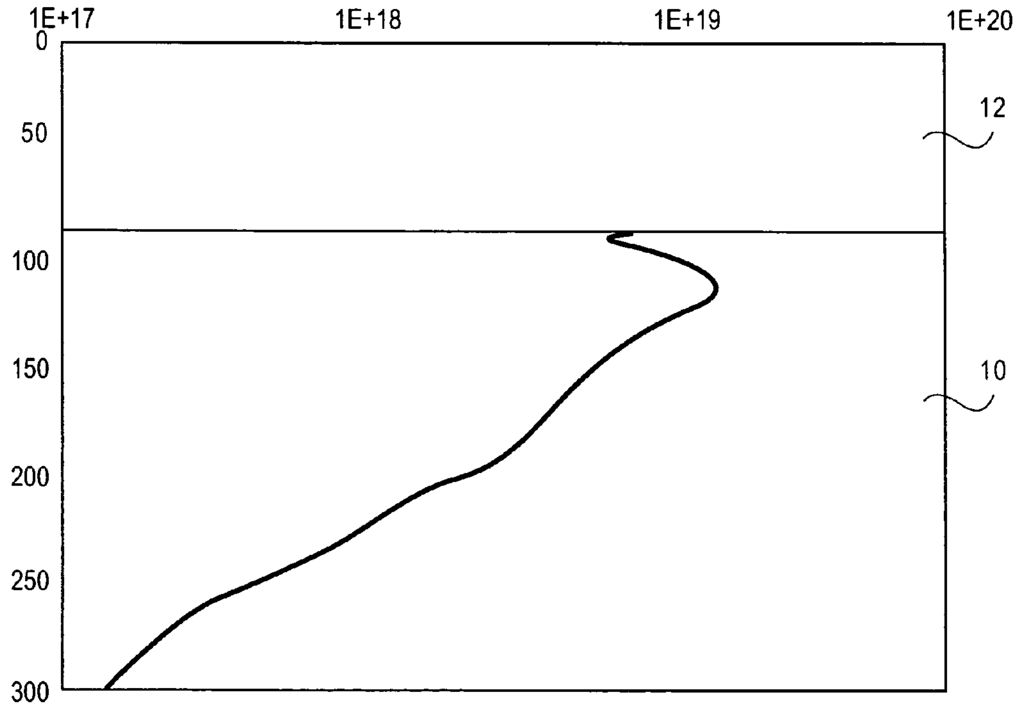
FIG. 2 illustrates the substrate of FIG. 1, after an un-doped or lightly doped semiconductor layer is grown on the substrate.
Figure 3:
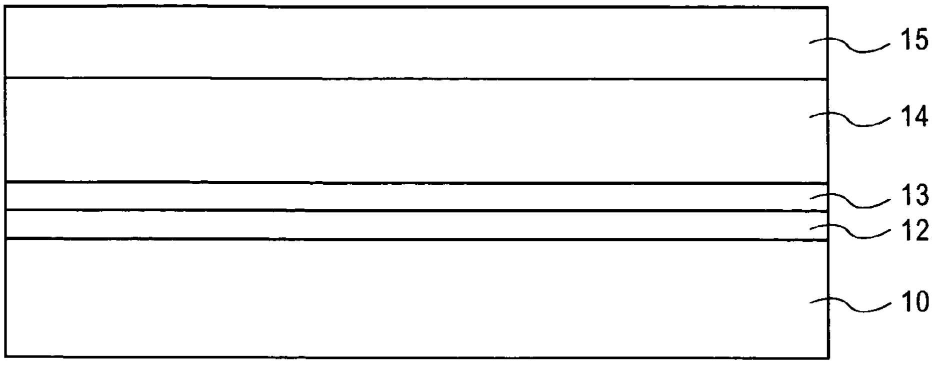
FIG. 3 is a cross-sectional, elevation view of the substrate and the semiconductor layer of FIG. 2, in addition to other layers used to form gates.

In FIG. 1, the upper approximately 200 nanometers (nm) of a monocrystalline silicon substrate 10 is illustrated. As shown, the upper region of this substrate is heavily doped with a dopant such as boron. The doping profile illustrates that the doping level has a peak below the surface in excess of $10^{19}$ atoms/$cm^3$, or higher. This doping profile may be achieved using ion implantation.

Following the doping of the substrate, a epitaxial layer, shown as a monocrystalline silicon layer 12, is formed on the upper surface of the substrate 10. For instance, the deposition of the epitaxial silicon layer 12 is carried out using dichloro-silane based chemistry in a single wafer CVD reactor, such as ASM E3000 reactor. The film is deposited with gas flows of 140-250 sccm of dicholoro silane ($SiH_2Cl_2$), 100-150 sccm HCl, 20 slm of $H_2$ at 825° C. and a process pressure of 20 Torr. Under these processing conditions, a deposition rate of 10-15 nm/min is achieved for silicon on the exposed substrate while achieving an excellent selectivity for spacer and oxide regions. The layer 12 may have the thickness of approximately 85 nm, and its doping concentration will be, for example, less than 1/100 of the buried peak doping concentration of the substrate.

Following the formation of the layer 12, an insulative layer 13 is formed on layer 10. Layer 13 may be a thin, thermally grown oxide layer or a deposited silicon dioxide layer. Next, a polysilicon layer 14 is deposited on the insulative layer 13. As will be seen, gates formed from the layer 14 are sacrificial. They are subsequently removed and metal is substituted for the regions occupied by these polysilicon gates. A hard mask 15 is formed on the polysilicon layer 14.

Figure 4:
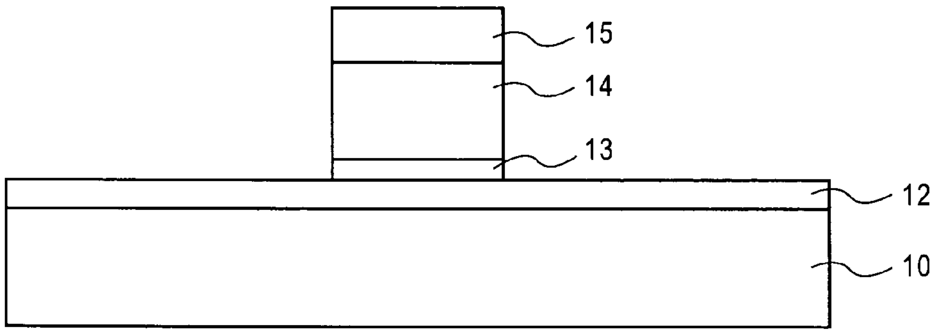
FIG. 4 illustrates the substrate of FIG. 3, after the formation of gates.

Next, as shown in FIG. 4, a sacrificial gate structure is fabricated by first masking and etching the hard mask layer 15 using ordinary photolithographic processing to define masking members for gates. Now, the polysilicon layer 14 and insulative layer 13 are etched in alignment with the hard mask 15 using ordinary etchants. The resultant structure is depicted in FIG. 4.

Figure 5:
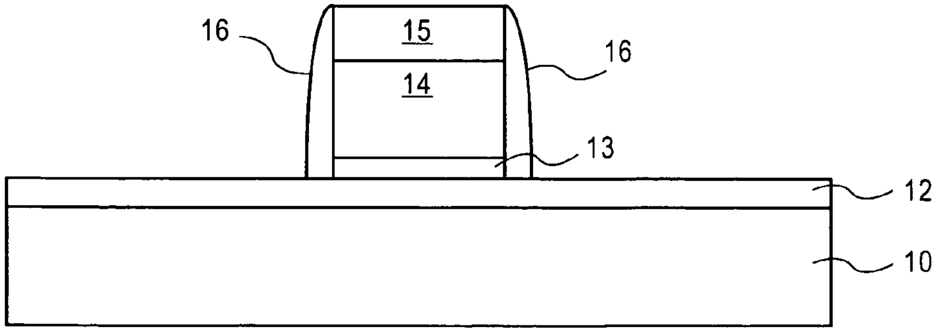
FIG. 5 illustrates the substrate of FIG. 4, after the formation of sidewall spacers on the gates.

As shown in FIG. 5, sidewalls 16 are then formed on the gate of FIG. 4. Relatively thin silicon nitride sidewall members 16 may be formed using ordinary sidewall processing. The purpose of these sidewall spacers is to protect the polysilicon during subsequent processing. Consequently, all sides of the polysilicon gate 14 are covered. Because the sidewall spacers are used for protection of the polysilicon, they may be relatively thin.

Figure 6:
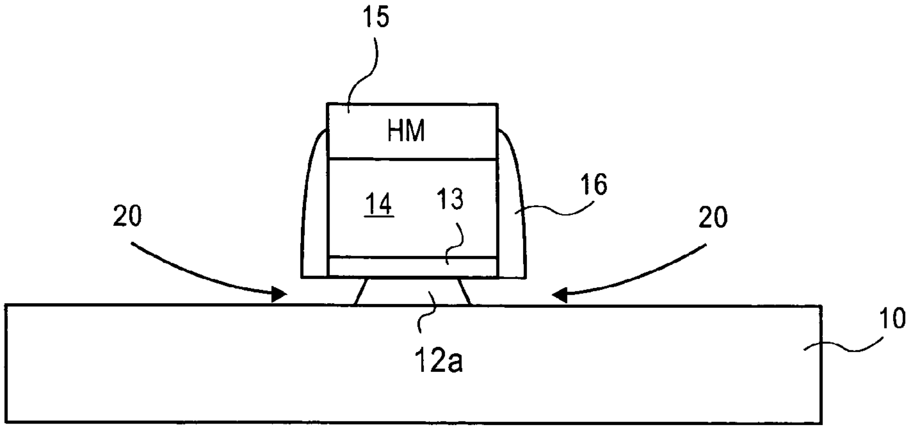
FIG. 6 illustrates the substrate of FIG. 5, after an etching step used to etch the semiconductor layer. This figure shows the undercutting of the gate.

Now, the layer 12 is etched to form a channel body 12*a*. The etching undercuts the gate structure as shown by the undercuts 20 in FIG. 6.

The layer 12 may be etched with a variety of hydroxide-based solutions. However, for high selectivity to the heavily doped substrate, relatively mild processing conditions and a wet etchant are employed. One method is treatment with an aqueous ammonium hydroxide solution in the concentration range 2-10% by volume at 25 degrees Celsius with a sonication transducer which dissipates ultra- or mega-sonic energy at a power of 0.5 to 5 W/cm$^2$.

Source and drain regions are then grown to establish a shallow, highly doped source/drain tip (extension) that laterally extends the distance under the gate edge to the channel body 12*a*. Separate processing is used for the p-channel and n-channel transistors with each of the source and drain regions being grown in different processing steps, both with in-situ doping. This results in the source and drain regions being highly doped, in one case with a p-type dopant, and in the other case with an n-type dopant.

In forming a PMOS transistor, the source/drain extension (tip) are raised source/drain regions formed by selectively depositing epitaxial boron (B) doped silicon or SiGe with germanium concentrations up to 30%. Under the processing conditions of 100 sccm of dichlorosilane (DCS), 20 slm $H_2$, 750-800° C., 20 Torr, 150-200 sccm HCl, a diborane ($B_2H_6$) flow of 150-200 sccm and a$GeH_4$ flow of 150-200 sccm, a highly doped SiGe film with a deposition rate of 20 nm/min, B concentration of 1E20 cm$^{-3}$ and a germanium concentration of 20% is achieved. A low resistivity of 0.7-0.9 mOhm-cm resulting from the high B concentration in the film provides the benefit of high conductivity in the tip source/drain regions and thereby reduced $R_{external}$. SiGe in the source/drain regions exerts compressive strain on the channel, which in turn results in enhanced mobility and improved transistor performance.

For an NMOS transistor, the source/drain regions are formed using in-situ phosphorous doped silicon deposited selectively under processing conditions of 100 sccm of DCS, 25-50 sccm HCl, 200-300 sccm of 1% $Ph_3$ with a carrier $H_2$ gas flow of 20 slm at 750° C. and 20 Torr. A phosphorous concentration of 2E20 cm$^{-3}$ with a resistivity of 0.4-0.6 mOhm-cm is achieved in the deposited film.

Figure 7:
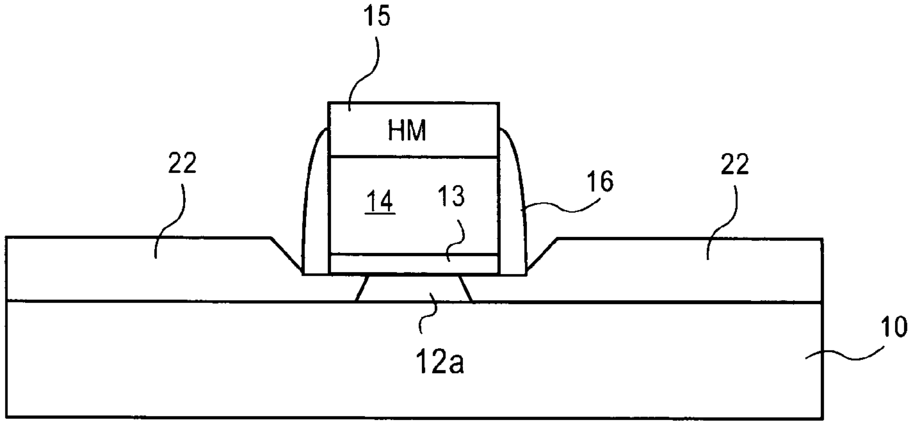
FIG. 7 illustrates the substrate of FIG. 6 following the epitaxial growth of source and drain regions.
Figure 8:
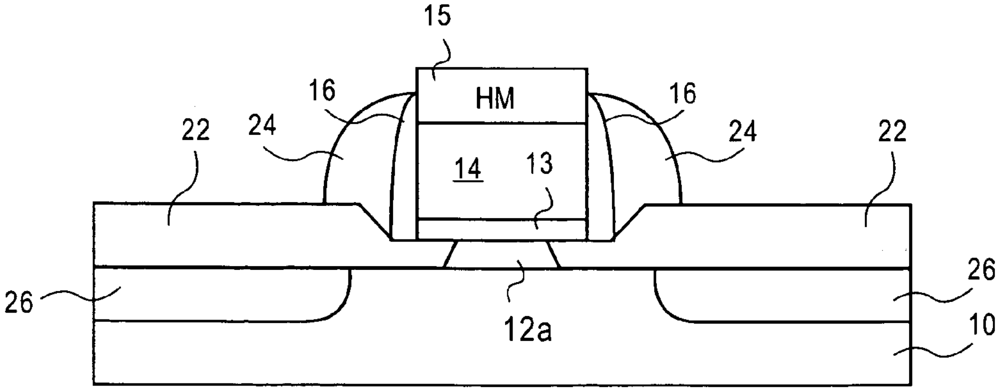
FIG. 8 illustrates the structure of FIG. 7, after the formation of additional spacers and the doping of the exposed portion of the source and drain regions.

After the source/drain regions are formed as illustrated in FIG. 7, additional spacers 24 are formed using ordinary processing. As an example, the spacers may be a silicon nitride or silicon dioxide spacers. Spacers 24 are relatively thick when compared to the thickness of the spacer 16 as shown in FIG. 8.

Ion implantation now occurs to from the source/drain regions 26 in the substrate 10. Again, separate ion implantation processes are used for the p-type dopant and n-type dopant. The regions 26 may be implanted to a level of $10^{20}$ atoms/cm$^3$.

Figure 9:
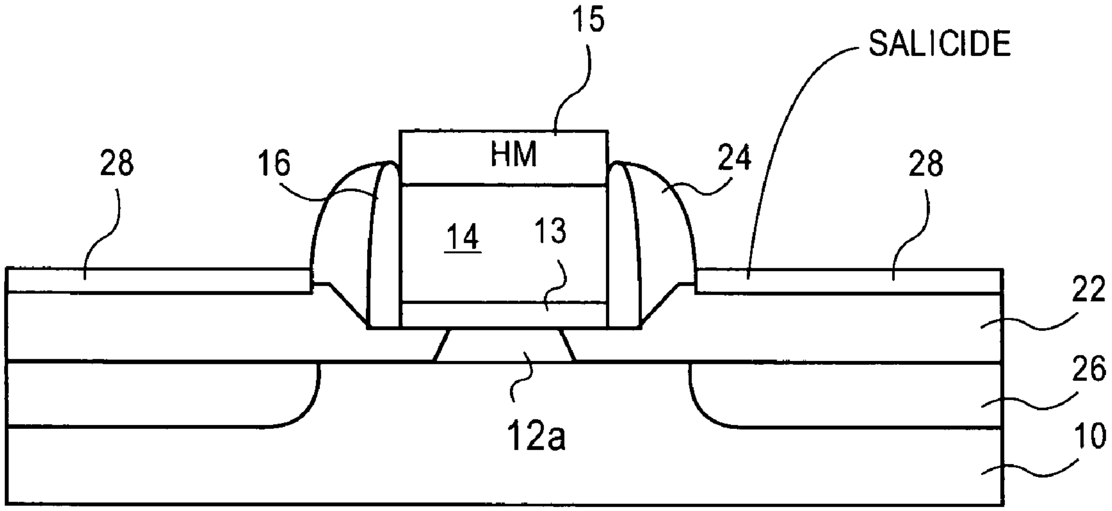
FIG. 9 illustrates the structure of FIG. 8 following the formation of a salicide layer.

As shown in FIG. 9, an ordinary silicide or salicide process is used to form the salicide layer 28 thereby making the upper surface of the source/drain regions more conductive.

Figure 10:
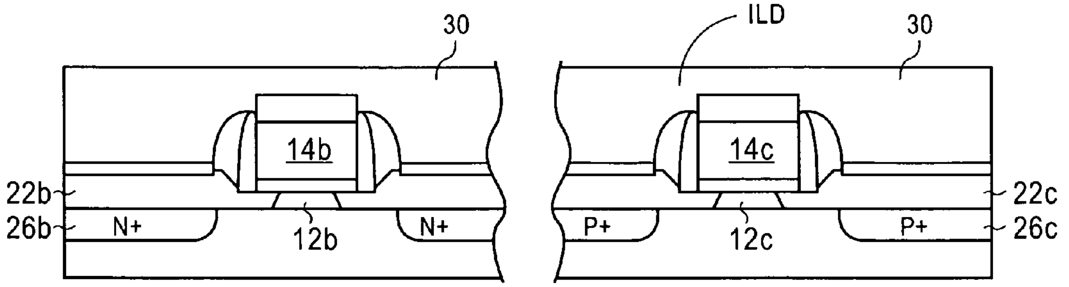
FIG. 10 illustrates the structure of FIG. 9 where two transistors are shown side-by-side, specifically an n-channel transistor and a p-channel transistor are depicted.

In FIG. 10, an n-channel transistor is depicted along side a p-channel transistor. The channel regions are shown as 12*b* for the n-channel transistor and 12*c* for the p-channel transistor. The letter "b" is used below, to denote the layers and regions for the n-channel transistor, and similarly, the letter "c" is used to designate the layers and regions for the p-channel transistor. The structure shown in FIG. 10 is the same as shown in FIG. 9 except that an ILD 30 is formed over the wafer. Any one of a plurality of dielectrics may be used for the ILD such as silicon dioxide, carbon doped silicon dioxide or other low-k dielectrics.

Figure 11:
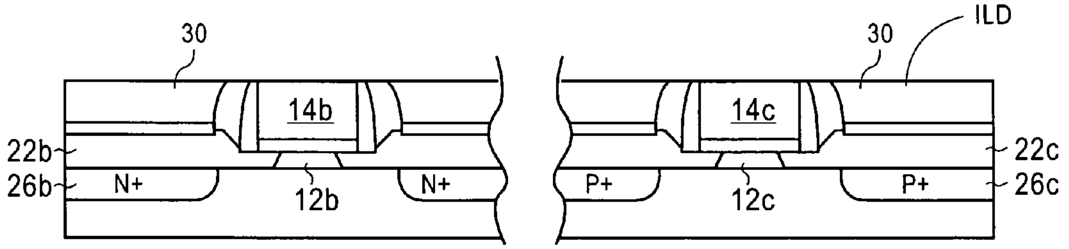
FIG. 11 illustrates the structure of FIG. 10 following the chemical mechanical polishing (CMP) of an interlayer dielectric (ILD).

Now, CMP is used to provide a planarized surface and to remove the salicide from the top of the gates 14*b* and 14*c*. The resultant structure is illustrated in FIG. 11.

Figure 12:
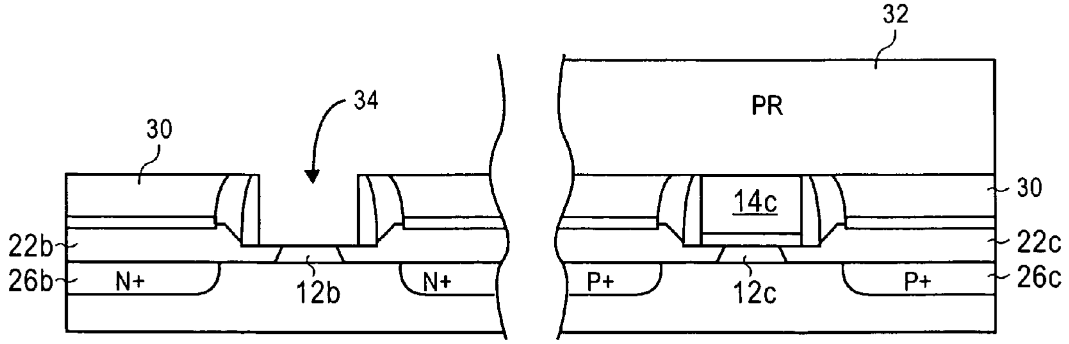
FIG. 12 illustrates the structure of FIG. 11, after the formation of a photoresist layer over the p-channel transistor region and the removal of the polysilicon gate and its underlying insulative layer from the n-channel gate.

Next, a photoresist layer 32 is formed over the p-channel transistors, and a wet etchant is used to remove the polysilicon from the n-channel transistors. The underlying insulative layer is also removed, forming the opening 34 depicted in FIG. 12.

Figure 13:
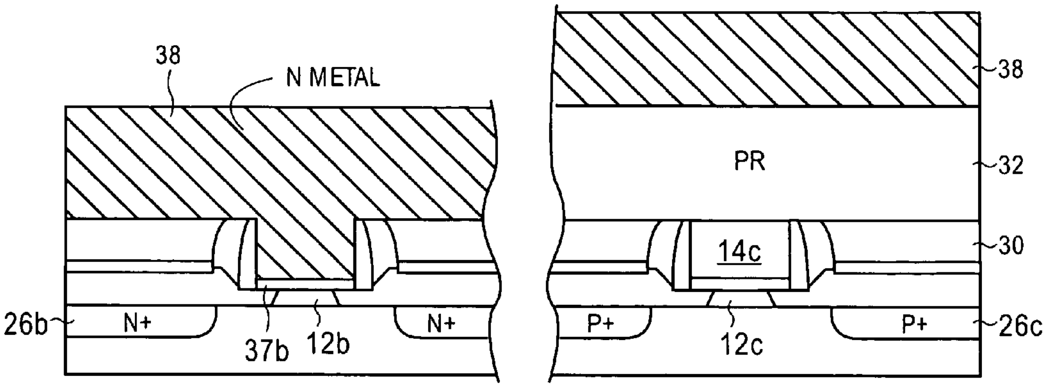
FIG. 13 illustrates the structure of FIG. 12 following the formation of an n-metal layer.

Now, as shown in FIG. 13, an insulative layer 37*b* is formed along with a metal layer 38, referred to as "n-metal" since it is the metal having the appropriate work function for the n-channel transistors. The gate dielectric, ideally has a high electric constant, such as a metal oxide dielectric, for instance, $HfO_2$, ZrO or other high-k dielectrics, such as PZT or BST. A high-k dielectric film can be formed by any well-known technique such as by chemical vapor deposition (CVD). The gate electrode layer 38 may be formed by blanket deposition of a suitable gate electrode material. In one embodiment, a gate electrode material comprises a metal film such as tungsten, tantalum and/or nitrides and alloys thereof. For the n-channel transistors, a work function in the range of 4.0 to 4.6 eV may be used.

Figure 14:
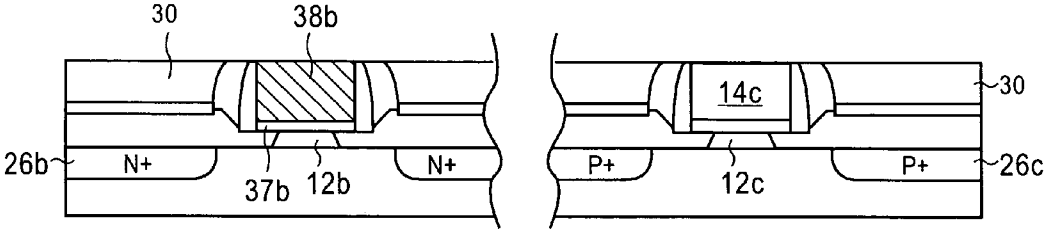
FIG. 14 illustrates the structure of FIG. 13 following a CMP process.

CMP is next used to planarize the surface, thereby removing the metal layer 38, except within the region formerly occupied by the polysilicon, gate. The resultant gate 38*b* and the underlying insulative layer 37*b* are illustrated in FIG. 14.

A wet etchant is used to remove the polysilicon gate associated with the p-channel transistors. Again, the underlying insulative layer is also removed so that a more appropriate insulative layer may be formed. The opening 42 of FIG. 15 results after the polysilicon gate and the underlying insulative layer are removed. A gate dielectric 37*c* is formed on the exposed silicon. This dielectric may be the same as dielectric 37*b*.

Figure 15:
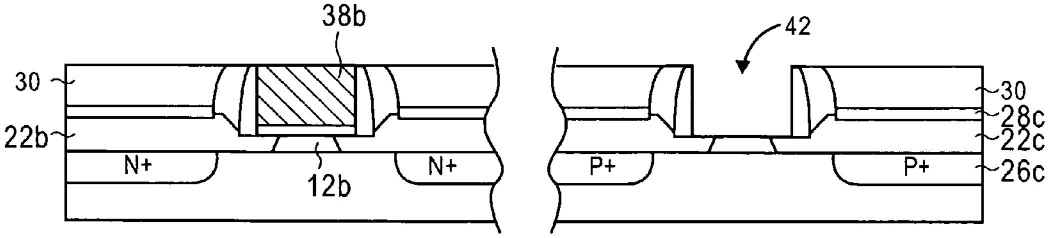
FIG. 15 illustrates the structure of FIG. 14 after the removal of the polysilicon gate and its underlying insulative layer from the p-channel gate.
Figure 16:
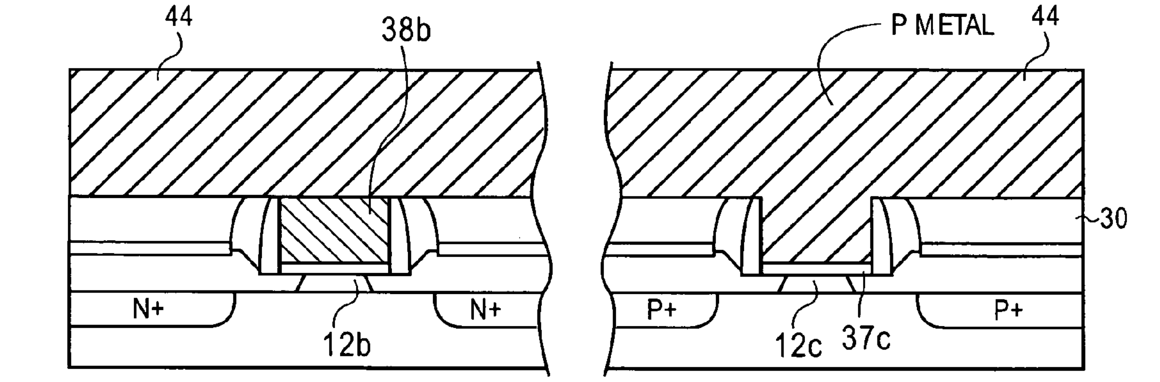
FIG. 16 illustrates the structure of FIG. 15 following the deposition of a p-metal.

A metal layer 44 is formed over the structure of FIG. 15 and the gate dielectric 37*b*. This is shown as a "p-metal" in FIG. 16 since the work function of this metal is appropriate for p-channel transistors. The p-metal may be of the same composition as the n-metal except that the work function is preferable between 4.6 to 5.2 eV.

Figure 17:
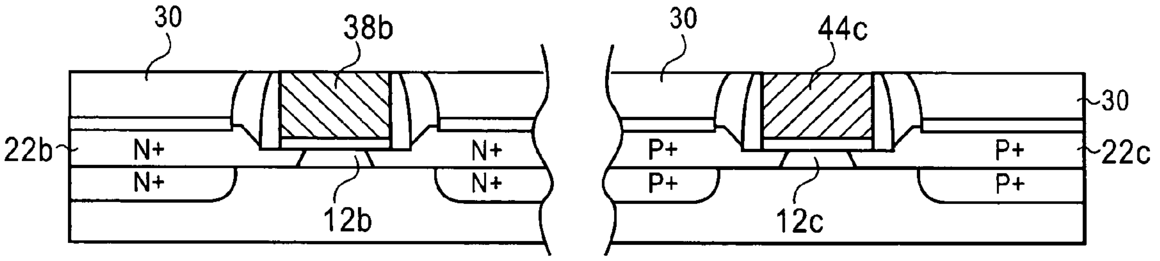
FIG. 17 illustrates the structure of FIG. 16 following a CMP process.

After the deposition of the p-metal, CMP is used to planarize the structure with the resultant structure being shown in FIG. 17. An n-channel transistor with a gate 37*b* and a channel region 12*b* results, and similarly, a p-channel transistor with a gate 44*c* and a channel region 12*c* results.

There are several advantages to the transistors of FIG. 17 and their fabrication when compared to prior art transistors. First, shallow tip (extension) junction depths are desirable to help support smaller transistor dimensions. When using traditional implanted tip techniques, minimum tip junction depths are limited by the necessary gate overlap. With the structure of FIG. 17 and the described processing, the gate overlap dimension and the junction depth can be better controlled. For instance, the wet etch can be timed to determine the extent of undercutting under the gate structure.

The shallow tip junction depths allow fabrication of shorter gate lengths without increasing off-state leakage current. Tip doping is needed under the gate edge to assure a low risistance path between the inversion layer under the gate and the highly doped source/drain tip region. The low resistance permits higher drive currents which are critical for circuit switching speed.

An advantage of the metal gate is that the processing can occur at lower temperatures. This is in addition to the better performance achieved with the metal gate when compared to a polysilicon gate. In the processing described above, lower temperature options are used to reduce the total thermal exposure. This as mentioned earlier, prevents the dopant from the substrate from diffusing into the channel region. Thus, a delta-doped transistor with a metal gate and method of fabrication have been described.

What is claimed is:

1. A semiconductor process comprising:

growing an un-doped or lightly doped silicon layer on a heavily doped substrate;

forming an insulating layer on the silicon layer;

forming sacrificial polysilicon gates on the insulating layer;

etching the silicon layer and undercutting the gates so as to form silicon channel regions under the polysilicon gates;

growing source and drain regions from the substrate which extend into the undercutting adjacent to the silicon channel regions;

removing the polysilicon gates; and forming metal gates in place of the polysilicon gates.

2. The process of claim 1, wherein the processing steps of claim 1 are carried out at low enough temperatures to prevent dopant from the substrate to substantially dope the silicon layer or silicon channel regions formed from the silicon layer.

3. The process of claim 1, wherein the etching of the silicon layer is done with a wet etchant which etches the silicon layer at a faster rate than the silicon substrate.

4. The process of claim 2, wherein the source and drain regions are selectively grown regions of silicon or silicon-germanium.

5. The process of claim 4, wherein the source and drain regions are heavily doped regions.

6. The process of claim 1, wherein:

the source and drain regions comprise first and second source and drain regions;

the first source and drain regions are selectively grown and heavily doped with an n-type dopant, and the second source and drain regions are selectively grown and heavily doped with a p-type dopant.

7. The process of claim 6, wherein:

the metal gates comprise first metal gates and second metal gates;

the first metal gates are formed above the first source and drain regions and have a work function of between 4.0 to 4.6 eV; and the second metal gates are formed above the second source and drain regions and have a work function of between 4.6 to 5.2 eV.

8. The process of claim 6, wherein the forming of the metal gates comprises:

removing the polysilicon gates disposed above the first source and drain regions;

depositing a first metal;

polishing away the first metal above the second source and drain regions;

removing the polysilicon gates disposed above the second source and drain regions; and depositing a second metal.

9. The process of claim 8, wherein the first metal has a work function of between 4.0 to 4.6 eV, and the second metal has a work function of between 4.6 and 5.2 eV.

10. A process for forming complementary transistors comprising:

forming a lightly doped or un-doped monocrystalline layer on a heavily doped monocrystalline substrate;

forming temporary polysilicon gates insulated from the monocrystalline layer;

etching the monocrystalline layer to form channel regions for the transistors, undercutting the polysilicon gates;

growing a first plurality of monocrystalline source and drain regions doped with an n-type dopant, extending from opposite sides of a first plurality of the channel regions including within the undercutting of the polysilicon gates disposed above the first plurality of source and drain regions;

growing a second plurality of monocrystalline source and drain regions doped with a p-type dopant, extending from opposite sides of a second plurality of the channel regions including within the undercutting of the polysilicon gates disposed above the second plurality of source and drain regions;

replacing the polysilicon gates associated with the first plurality of source and drain regions with a first metal; and replacing the polysilicon gates associated with the second plurality of source and drain regions with a second metal.

11. The process of claim 10, wherein first side spacers are formed on the polysilicon gates before the etching of the layer.

12. The process of claim 11, wherein second side spacers are formed on the first spacers following the formation of the first and second source and drain regions.

13. The process of claim 12, including further doping the first and second source and drain regions and the substrate in alignment with the second spacers.

14. The process of claim 10, wherein the first metal has a work function of between 4.0 to 4.6 eV, and the second metal has a work function of between 4.6 to 5.2 eV.

* * * * *